(12) United States Patent
Lee et al.

(10) Patent No.: US 10,109,746 B2
(45) Date of Patent: Oct. 23, 2018

(54) GRAPHENE TRANSISTOR AND TERNARY LOGIC DEVICE USING THE SAME

(71) Applicant: GWANGJU INSTITUTE OF SCIENCE AND TECHNOLOGY, Gwangju (KR)

(72) Inventors: Byoung Hun Lee, Gwangju (KR); Yun Ji Kim, Gwangju (KR); So Young Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/424,154

(22) Filed: Feb. 3, 2017

(65) Prior Publication Data

US 2017/0229587 A1  Aug. 10, 2017

(30) Foreign Application Priority Data

Feb. 5, 2016  (KR) ........................ 10-2016-0015088

(51) Int. Cl.
| | |
|---|---|
| *H01L 29/786* | (2006.01) |
| *H01L 21/04* | (2006.01) |
| *H01L 29/16* | (2006.01) |
| *H01L 29/66* | (2006.01) |
| *H01L 27/12* | (2006.01) |

(52) U.S. Cl.
CPC ...... *H01L 29/78696* (2013.01); *H01L 21/041* (2013.01); *H01L 27/1214* (2013.01); *H01L 29/1606* (2013.01); *H01L 29/66977* (2013.01); *H01L 29/78684* (2013.01)

(58) Field of Classification Search
CPC .......... H01L 29/1606; H01L 29/66015; H01L 29/78696; H01L 21/041; H01L 29/66037; H01L 29/66045; H01L 29/78684
See application file for complete search history.

(56) References Cited

U.S. PATENT DOCUMENTS

| | | | | |
|---|---|---|---|---|
| 2011/0278545 | A1* | 11/2011 | Voutilainen | ............... B32B 3/10 257/29 |
| 2011/0315961 | A1* | 12/2011 | Chen | ................... H01L 29/1606 257/29 |
| 2014/0292381 | A1* | 10/2014 | Appenzeller | ....... H01L 29/1606 327/119 |

* cited by examiner

*Primary Examiner* — David Spalla
(74) *Attorney, Agent, or Firm* — Hauptman Ham, LLP

(57) ABSTRACT

Disclosed is a graphene transistor using graphene as a channel region and a logic device using the same. A doping metal layer is provided over a graphene channel of the graphene transistor. The doping metal layer has a work function higher or lower than that of the graphene. When the doping metal layer has a work function lower than that of the graphene, the graphene, which is below the doping metal layer, is doped with an n-type. Also, when the doping metal layer has a work function higher than that of the graphene, the graphene, which is below the doping metal layer, is doped with a p-type. As described above, various aspects of junction may be implemented in the graphene channel, and three states may be obtained from a single transistor.

15 Claims, 10 Drawing Sheets

GRAPHENE TRANSISTOR AND TERNARY LOGIC DEVICE USING THE SAME

CROSS-REFERENCE TO RELATED APPLICATIONS

This application claims the priority of Korean Patent Application No. 10-2016-0015088 filed on Feb. 5, 2016, in the Korean Intellectual Property Office, the disclosure of which is hereby incorporated by reference in its entirety.

BACKGROUND

1. Technical Field

The present disclosure relates to a graphene transistor and a logic device, and more particularly, to a transistor in which graphene configured to form a channel region is doped with a specific conductive type, and to a logic device capable of forming ternary data by combining such transistors.

2. Description of the Related Art

Graphene is a carbon conjugate having an SP2 hybridized bond structure. Graphene shows a behavior different from that of each of materials which are conventionally described by solid-state physics, and a representative behavior is a zero-band overlap phenomenon. That is, the graphene has a semiconductor characteristic in which a band gap is almost close to zero, and a conduction band and a valance band form a conical shape within an extremely low range with respect to a Fermi level. This refers to Dirac cones.

Meanwhile, there is some limitation to manufacturing in an electronic device using the graphene. A most representative obstacle is Klein tunneling, and the Klein tunneling is a theory describing behaviors of electrons in the graphene and refers to a phenomenon in which the electrons in the graphene can move by tunneling irrespective of a barrier condition even when an energy barrier exists. Therefore, the graphene has a characteristic that is difficult to cause a rectifying operation by configuring a diode and the like. Also, such characteristic serves to a limitation to manufacturing in a transistor based on a p-n junction.

Further, a transistor, which is manufactured using a conventional semiconductor based on silicon and the like, performs an operation in two regions which are roughly classified.

First, such a transistor operates as a switch in a linear region. That is, when a gate voltage is applied to cause a strong inversion in a channel region and an amount of current between a source and a drain is small, the transistor serves as a switch that performs ON/OFF operations.

Second, such a transistor operates as a current source in a saturation region. When the transistor serves as a current source, it is used as an active load in a small signal region.

In a conventional digital semiconductor device, a transistor is used as a switch. Therefore, when an inverter or a buffer is configured, a transistor outputs only signals of two type due to ON/OFF operations. That is, there is a characteristic in which only a binary logic of "0" and "1" is output in a digital signal.

In recent years, a semiconductor device, which should process a large amount of information in the same area, has a limitation only by the use of a conventional binary logic. Consequently, there is an increasing demand for a memory and the like to implement other states in addition to binary logic states to process more information and store more information in a single logic device or memory unit.

SUMMARY

It is a first technical object of the present disclosure to provide a graphene transistor having three steps according to a gate applied voltage.

It is a second technical object of the present disclosure to provide a logic device using the graphene transistor that is provided by the first object.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

To attain the first technical object, the present disclosure provides a graphene transistor including a gate electrode having conductivity; a dielectric layer formed on the gate electrode; a graphene channel having a single-layer graphene formed on the dielectric layer; a source electrode and a drain electrode respectively formed at both end portions of the graphene channel based thereon and on the dielectric layer; a doping metal layer formed at a selected region of the graphene channel and configured to dope the graphene channel, which is below the doping metal layer, with a predetermined conductive type; and a passivation layer formed on the graphene channel and configured to shield the graphene channel and the doping metal layer, wherein the graphene channel includes a doped graphene region disposed below the doping metal layer and having the predetermined conductive type; a first graphene region formed at one side of the doped graphene region and having a Fermi level different from that of the doped graphene region; and a second graphene region opposite to the first graphene region based on the doped graphene region and having a Fermi level different from that of the doped graphene region.

Also, to attain the second technical object, the present disclosure provides an inverter including a first graphene transistor connected to a positive source voltage; and a second graphene transistor connected to a ground or a negative source voltage, wherein the first graphene transistor includes a first doping metal layer in which an upper portion of a first graphene channel has a work function lower than that of graphene, the second graphene transistor includes a second doping metal layer in which an upper portion of a second graphene channel has a work function higher than that of the graphene, gate terminals of the first graphene transistor and the second graphene transistor are commonly connected to an input signal, and drain terminals of the first graphene transistor and the second graphene transistor are commonly connected to an output signal.

In accordance with the present disclosure, the graphene transistor includes a graphene region that is doped with a specific conductive type. Also, the graphene transistor has a maximum value of resistance at a Dirac point of an undoped graphene region, and further has a maximum value of resistance at a Dirac point of a doped graphene region. Using such maximum values, three states may be implemented. That is, through a region having a low channel resistance in addition to two Dirac points, a region having a maximum value of resistance according to a Dirac point of a doped graphene region, and a region having a maximum value of resistance of an undoped graphene region, three output states may be obtained.

Also, an inverter formed using the graphene transistor may implements the three output states.

DETAILED DESCRIPTION

Figure 1:
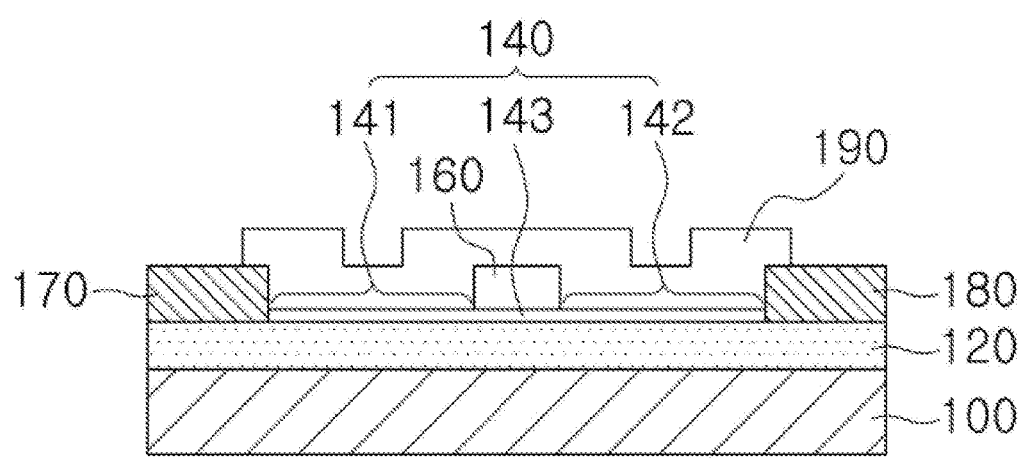
FIG. 1 is cross-sectional view illustrating a graphene transistor according to a first embodiment of the present disclosure.

The present disclosure may be modified in various forms and may have a variety of embodiments, and, therefore, specific embodiments will be illustrated in the drawings and a description thereof will be described in detail in the following description. The embodiments to be disclosed below, therefore, are not to be taken in a sense which limits the present disclosure to specific embodiments, and should be construed to include modification, equivalents, or substitutes within the spirit and technical scope of the present disclosure. In describing each drawing, a similar reference numeral is given to a similar component.

Unless otherwise defined, all terms including technical or scientific terms used herein have the same meaning as commonly understood by those skilled in the art to which the present disclosure pertains. General terms that are defined in a dictionary shall be construed to have meanings that are consistent in the context of the relevant art, and will not be interpreted as having an idealistic or excessively formalistic meaning unless clearly defined in the present application.

Hereinafter, preferred embodiments of the present disclosure will be described in detail with reference to the accompanying drawings.

First Embodiment

FIG. 1 is cross-sectional view illustrating a graphene transistor according to a first embodiment of the present disclosure.

Referring to FIG. 1, a graphene transistor includes a gate electrode 100, a dielectric layer 120, a graphene channel 140, a doping metal layer 160, a source electrode 170, a drain electrode 180, and a passivation layer 190.

First, the dielectric layer 120 is formed over the gate electrode 100. The gate electrode 100 may be formed with a heavily doped semiconductor layer or a metal material.

When the gate electrode 100 is a heavily doped semiconductor layer, it is preferable that the semiconductor layer has a silicon material. Also, the semiconductor layer may be a silicon substrate, and may be preferable to be heavily doped with a p-type or an n-type.

The dielectric layer 120 formed over the gate electrode 100 may be configured with a silicon oxide or a silicon nitride which is as an insulating material. However, the dielectric layer 120 may employ any material capable of applying an electric field from the gate electrode 100 to the graphene channel 140, and achieving electrical insulation between the gate electrode 100 and the graphene channel 140.

The graphene channel 140 is formed over the dielectric layer 120. The graphene channel 140 may be preferable to be configured with a single-layer graphene. When a single-layer graphene is provided, a Klein tunneling phenomenon may be used. Otherwise, when a plurality of graphene is formed as a graphene channel, a Klein tunneling phenomenon may not effectively occur.

The doping metal layer 160 is provided over the graphene channel 140. The doping metal layer 160 induces an effect in which the graphene channel 140 located at a lower region is doped with a specific conductive type. That is, when a work function of the doping metal layer 160 is higher than that of graphene, a kind of channel region, which is configured with a doping metal layer/graphene, may be interpreted as having a positive work function and thus it may be interpreted as a channel doped with holes from the outside. Also, when the work function of the doping metal layer 160 is lower than that of graphene, a kind of channel region, which is configured with a doping metal layer/graphene, may be interpreted as having a negative work function and thus it may be interpreted as an electron doped channel region in which free electrons are formed.

However, the doping metal layer 160 may not be formed across the entire graphene channel 140 and may be formed at a central portion of the graphene channel 140. Consequently, the graphene channel 140 may be divided into a region in which the doping metal layer 160 is not formed/a region in which the doping metal layer 160 is formed/a region in which the doping metal layer 160 is not formed. A region of the graphene channel 140 in which the doping metal layer 160 is formed is referred to a doped graphene region 143, and regions of the graphene channel 140, which are formed at left and right sides based on the region of the graphene channel 140 in which the doping metal layer 160 is formed, are respectively referred to a first graphene region 141 and a second graphene region 142. Consequently, each of the first graphene region 141 and the second graphene region 142 may form an intrinsic region of which does not represent a specific conductive type under a condition in which a bias is not applied from the gate electrode 100. Also, each of the first graphene region 141 and the second graphene region 142 may be doped with a conductive type different from that of the doped graphene region 143 under the condition in which the bias is not applied from the gate electrode 100. For example, when the doped graphene region 143 has an n-conductive type, each of the first graphene region 141 and the second graphene region 142 may have a p-conductive type.

Also, the source electrode 170 and the drain electrode 180 are respectively formed at both end portions of the graphene channel 140 and over the dielectric layer 120. The source electrode 170 and the drain electrode 180 may be preferably formed with a metal material.

Further, the passivation layer 190 is formed over the graphene channel 140, the doping metal layer 160, the source electrode 170, and the drain electrode 180. The passivation layer 190 may employ any material capable of protecting the graphene channel 140 from an external environment. For example, $Al_2O_3$ may be used as the passivation layer 190.

In the doped graphene region 143 over which the doping metal layer 160 is formed, a Fermi level of graphene is changed due to a doped metal.

For example, when the doping metal layer 160 is configured with metal having a work function lower than that of graphene, a Fermi level of the doped graphene region 143 is raised. Consequently, in a situation in which a bias is not applied to the gate electrode 100, a carrier in the doped graphene region 143 is an electron.

In addition, when the doping metal layer 160 has a work function higher than that of graphene, the Fermi level of the doped graphene region 143 is dropped. Therefore, in the situation in which the bias is not applied to the gate electrode 100, the carrier in the doped graphene region 143 is a hole.

The doping metal layer 160, which is used to form the doped graphene region 143, has a work function different from that of graphene. Here, metal having a work function greatly different from that of graphene may be preferably used as the doping metal layer 160.

For example, when Al or Ti is used as the doping metal layer 160, a carrier in the doped graphene region 143 is an electron, whereas, when Ni, Au, Pd, or Pt is used as the doping metal layer 160, the carrier in the doped graphene region 143 is a hole. Here, this is assumed that a bias is not applied to the gate electrode 100.

Figure 2:
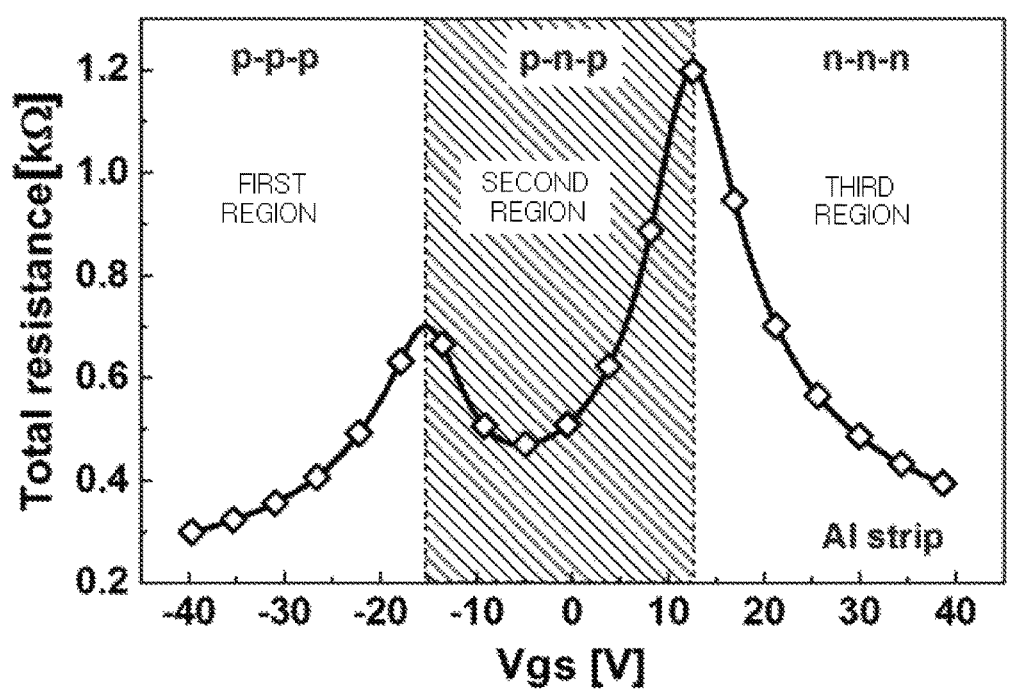
FIG. 2 is a graph illustrating an operation of the graphene transistor according to the first embodiment of the present disclosure.

FIG. 2 is a graph illustrating an operation of the graphene transistor according to the first embodiment of the present disclosure.

Referring to FIG. 2, a p++ heavily doped silicon substrate is used as the gate electrode 100. Also, silicon oxide is used as the dielectric layer 120, and a thickness of the dielectric layer 120 is 90 nanometers (nm). Further, Au is used as the source electrode 170 and the drain electrode 180, and a length of the graphene channel 140 between the source electrode 170 and the drain electrode 180 is set to 9 micrometers (um). A single-layer graphene is used as a graphene channel in a space between the graphene channel 140. In addition, the doping metal layer 160 has a thickness of 10 nm and a width of 2 um. Therefore, the first graphene region 141 has a width of 3 um, the doped graphene region 143 has a width of 2 um, and the second graphene region 142 has a length of 4 um.

By applying a voltage between the gate electrode 100 and the source electrode 170 and between the drain electrode 180 and the source electrode 170, a variance of resistance in the graphene channel 140 according to a variance of a gate-source voltage Vgs is measured.

In a first region, the gate-source voltage Vgs has a value in the range of −40 volts (V) to −15V. That is, as a negative voltage value is increased, density of holes induced in the graphene channel 140 is increased. Therefore, as an absolute value of the gate-source voltage Vgs is increased, resistance of the graphene channel 140 is decreased. That is, in the first region, since the density of holes induced in the graphene channel 140 as the gate-source voltage Vgs is increased, there is a characteristic in which resistance is increased. Specifically, in the first region, there is a characteristic in which holes are induced rather than electrons even in the doped graphene region 143.

Also, in a second region, as the gate-source voltage Vgs is increased from −15V, electrons begin to be induced rather than holes in the doped graphene region 143. Therefore, density of carriers in the doped graphene region 143 is gradually increased. This is shown as decrease of resistance in the graphene channel 140. That is, the holes serve as the carriers in the first graphene region 141 and the second graphene region 142, whereas the electrons serve as the carriers in the doped graphene region 143. Also, as shown in a Klein tunneling phenomenon, a band gap appearing between different conductive types does not affect to movement of electrons, and thus there is no need to consider a formation of a depletion region that appears in a conventional junction semiconductor. That is, there is no consideration of a formation of a depletion region due to a recombination of electron and hole and a formation of a potential barrier due to the formation of a depletion region. Also, a recombination probability of electron and hole in each channel region is very low.

Since the recombination of electron and hole is insignificant, a carrier concentration in each channel region determines an overall resistance of the graphene channel 140. Therefore, the overall resistance of the graphene channel 140 is decreased until it reaches a Dirac point at which an effective mass of a carrier becomes zero.

When the gate-source voltage Vgs greater than the Dirac point is continuously applied and gradually increased, concentration of electrons, which are carriers in the doped graphene region 143, is increased, whereas concentration of holes, which are carriers in the first graphene region 141 and the second graphene region 142, is decreased. Also, resistance or conductivity in the graphene channel 140 is determined by a graphene region having a lowest carrier concentration among the graphene regions 141, 142, and 143. Consequently, the resistance is increased due to the decreased concentration of holes in each of the first graphene region 141 and the second graphene region 142. This increase continues until the gate-source voltage Vgs rises up to 12V.

Afterward, in a third region, as the gate-source voltage Vgs is increased, the resistance in the graphene channel 140 is decreased. This is because that the first graphene region 141 or the second graphene region 142, which has holes as carriers over the gate-source voltage Vgs of 12V at which the third region is initiated, begins to have electrons as the carriers. Consequently, as the gate-source voltage Vgs is increased, concentrations of electrons are increased in the first graphene region 141 and the second graphene region 142. As such, as the gate-source voltage Vgs is increased, the resistance in the graphene channel 140 is decreased.

Figure 3:
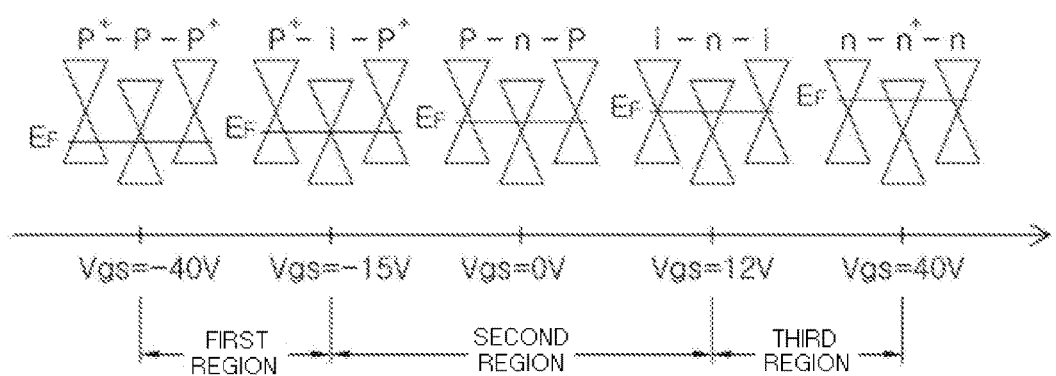
FIG. 3 is a band diagram for additionally describing the operation on the graph of FIG. 2 according to the first embodiment of the present disclosure.

FIG. 3 is a band diagram for additionally describing the operation on the graph of FIG. 2 according to the first embodiment of the present disclosure.

Referring to FIG. 3, in the first region, the first graphene region 141, the doped graphene region 143, and the second graphene region 142 have a $p^+$-p-$p^+$ junction structure. The gate-source voltage Vgs has a high negative value. Therefore, resistance in the graphene channel 140 has a low value according to an electric field induced by a high electric field as an absolute value of the gate-source voltage Vgs is increased. Specifically, the resistance in the graphene channel 140 is determined by density of holes induced in the doped graphene region 143. The doped graphene region 143 is in a state of being doped with an n-type, but it shows a state of being doped with a p-type due to inversion by a strong electric field.

Also, a Dirac point appears in the doped graphene region 143 at a gate voltage of −15V that is a boundary point between the first region and the second region. That is, an effective mass of each of an electron and a hole in the doped graphene region 143 becomes zero. This refers to an inflection point of resistance. At the Dirac point in the doped graphene region 143, the first graphene region 141, the doped graphene region 143, and the second graphene region 142 have a $p^+$-i(intrinsic)-$p^+$ junction structure. That is, the doped graphene region 143 represents a characteristic of an intrinsic semiconductor.

In the second region, a p-n-p junction is strengthened as the gate-source voltage Vgs is increased. That is, when the gate-source voltage Vgs is increased in a positive direction from −15V that is the boundary point of the second region, electrons are induced in the doped graphene region 143 of the Dirac point. The is because of movement of a Fermi level to the conduction band of the doped graphene region 143 due to a rising of the Fermi level.

When the gate-source voltage Vgs is continuously increased in the positive direction, a Fermi level in the conduction band of the doped graphene region 143 is raised, and an overall resistance in the graphene channel 140 is decreased. The decrease of resistance continues until it reaches a Dirac point at which an effective resistance of each of all carriers in the first graphene region 141, the second graphene region 142, and the doped graphene region 143 becomes zero.

Thereafter, when the gate-source voltage Vgs more rises in the second region, electrons in the doped graphene region 143 is increased, whereas density of holes in each of the first graphene region 141 and the second graphene region 142 is decreased. Consequently, the resistance is increased as the gate-source voltage Vgs rises. This continues until Vgs of 12V, which is a boundary point between the second region and the third region, is applied.

The resistance reaches the Dirac point in each of the first graphene region 141 and the second graphene region 142 due to a rising of a Fermi level Ef at the boundary point between the second region and the third region. That is, the resistance reaches a boundary point between an electron and a hole. At the boundary point, the resistance in the graphene channel 140 becomes a maximum value and an i-n-i junction is formed.

When the gate-source voltage Vgs enters the third region, electrons are increased in the first graphene region 141 and the second graphene region 142. That is, an n-$n^+$-n junction is formed in the third region. A factor determining resistance in each of the formed junctions is a concentration of the electrons in the first graphene region 141 or the second graphene region 142. Consequently, there is a characteristic in which the resistance is decreased as the gate-source voltage Vgs being applied is increased.

The second region as described above in FIGS. 2 and 3 is configured from the Dirac point in the first graphene region 143 to those in the doped graphene region 141 and the second graphene region 142. Also, the inflection point of the resistance in the second region occurs at a low point at which a sum of absolute values of the density of electrons and holes in the entire graphene channels is maximum.

The above-mentioned characteristics of FIGS. 2 and 3 describe a case in which Al is used as the doping metal layer 160. That is, under a condition in which Vgs is 0V, the doped graphene region 143 is doped with an n-type. The doping metal layer 160, which may be used for an n-type doping, may include Al or Ti.

When Ni, Au, Pd, or Pt is used as the doping metal layer 160, the doped graphene region 143 is doped with a p-type. Therefore, under a condition in which Vgs is applied, there occurs a phenomenon in which the junction is changed in the order of p-$p^+$-p, n-p-n, $n^+$-i-$n^+$, and $n^+$-n-$n^+$. That is, the structure of p-$p^+$-p occurs from a point having a largest negative value, and resistance in the channel region is increased as Vgs is gradually increased. Also, the Dirac point appears in each of the first graphene region 141 and the second graphene region 142.

In the next second region, each of the first graphene region 141 and the second graphene region 142 is inverted in an n-type, and the doped graphene region 143 maintains a p-type. Consequently, as a voltage is increased, the resistance in the channel region is also decreased.

The resistance has a minimum value at the Dirac point at which an effective resistance of entire carriers in the three graphene regions 141, 143, and 142 becomes zero due to the increase of Vgs. When the voltage is continuously increased, the resistance in the graphene channel is gradually increased to reach the Dirac point in the doped channel region. Therefore, a channel resistance has a maximum value.

Afterward, when the voltage is increased, the third region is initiated and the resistance in the graphene channel is decreased according to application of Vgs.

Figure 4:
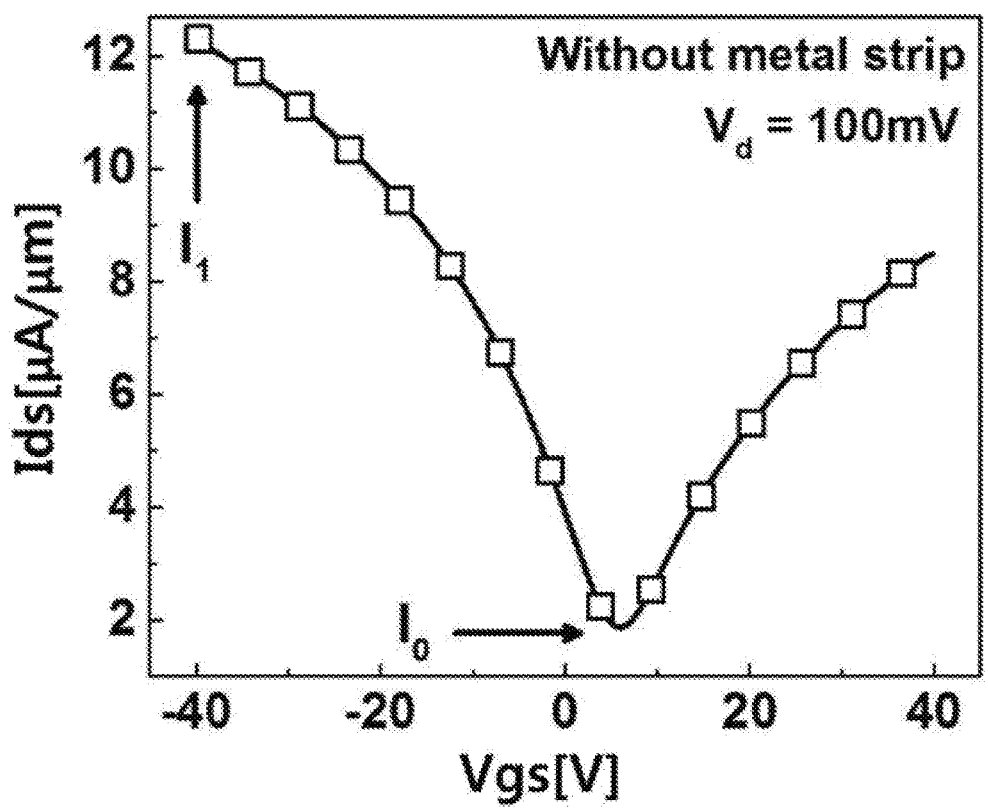
FIGS. 4 and 5 are graphs for comparing characteristics of the graphene transistors of FIGS. 2 and 3 according to the first embodiment of the present disclosure.
Figure 5:
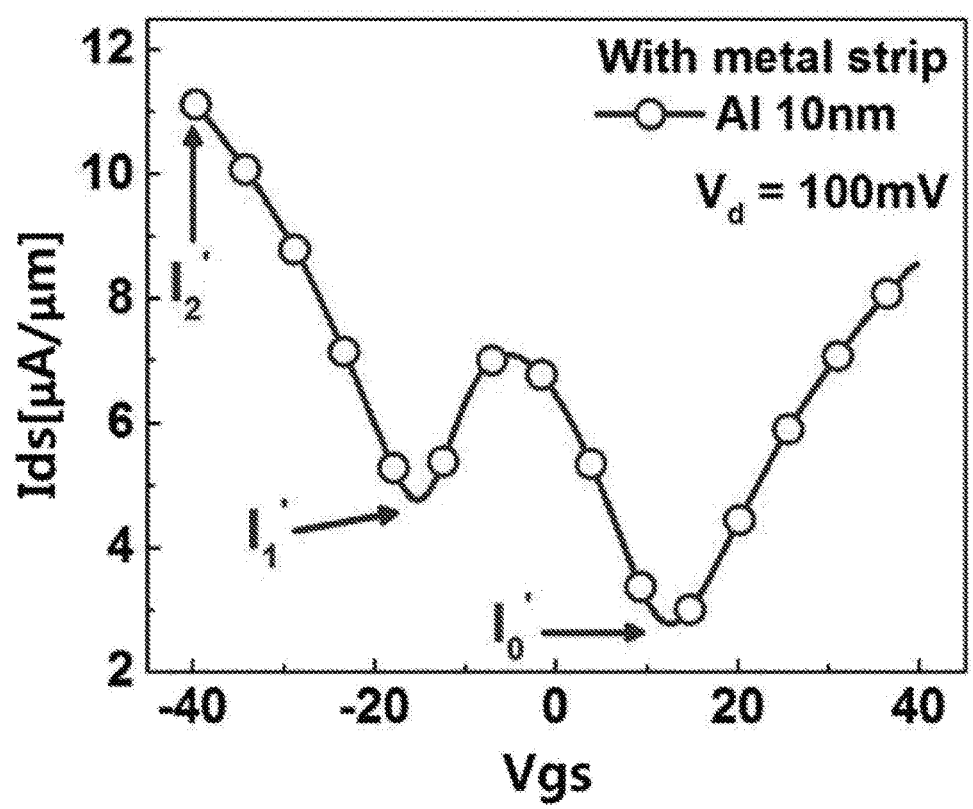

FIGS. 4 and 5 is graphs for comparing characteristics of the graphene transistor of FIGS. 2 and 3 according to the first embodiment of the present disclosure.

FIG. 4 shows a graphene transistor which is formed under a condition the same as that in each of FIGS. 2 and 3 without forming the doping metal layer 160, and FIG. 5 shows a graphene transistor the same as that in each of FIGS. 2 and 3 in which the doping metal layer 160 is formed.

Referring to FIG. 4, a gate-source voltage Vgs swings in the range of about −40V to 40V, and a voltage difference $V_d$ between a drain and a source is set to 100 millivolts (mV). Also, drain current density Ids according to the described above represents line current density of a graphene channel. That is, a current, which flows at a line perpendicular to a current direction in the graphene channel, is represented by the drain current density Ids. A single Dirac point exists across the entire range of the gate-source voltage Vgs, and drain current density Ids at the single Dirac point has a lowest current value $I_0$. That is, a left graph of the single Dirac point represents a case in which carriers in the graphene channel are holes, and a right graph thereof represents a case in which the carriers in the graphene channel are electrons. The graphene transistor having such characteristics may operate in a state of forming a high output current value $I_1$, and in a state of forming the lowest output current value $I_0$.

Referring to FIG. 5, a current may have three output states under the same condition of the gate-source voltage Vgs. $I_0'$ represents a current value at a Dirac point in the first graphene region 141 and the second graphene region 142, and $I_1'$ represents a current value at a Dirac point in the doped graphene region 143. Also, $I_2'$ represents a current value having low resistance except for the above described two Dirac points. Using such current values, three current states may be represented.

Also, in the present embodiment, separate hydrogen annealing may be preferably performed after the doping metal layer 160.

For example, hydrogen annealing may be performed before the doping metal layer 160 is shielded with the passivation layer 190, or after the passivation layer 190 is formed. The hydrogen annealing is performed in the range not causing damage to graphene, and an annealing condition includes a temperature in the range of 200 to 300° C., pressure in the range of 20 to 30 atmospheric pressure, and a time in the range of 1 to 4 hours. When an annealing temperature is less than 200° C. or annealing pressure is less than 20 atmospheric pressure, hydrogen gas does not sufficiently penetrate into an interface between the doping metal layer 160 and the graphene channel 140 such that an effect of the annealing may not be obtained. Also, when an annealing temperature is greater than 300° C., a thermal damage to the graphene channel 140 occurs. When pressure is greater than 30 atmospheric pressure, it is difficult to maintain the annealing process.

Considering a manufacturing process, the dielectric layer 120 is formed over the gate electrode 100 that is doped with a p-type or an n-type. The gate electrode 100 may be a silicon substrate doped with a specific conductive type. Therefore, the dielectric layer 120 is formed over the gate electrode 100 using a conventional deposition.

Afterward, the graphene channel 140 is formed over the dielectric layer 120. The graphene channel 140 may be preferably a single-layer graphene. To form the single-layer graphene, a graphene transfer process may be employed.

That is, graphene is formed on a catalytic substrate using a chemical vapor deposition. The catalytic substrate being used may be Ni, Fe, or Cu, and Cu may be preferably used as the catalytic substrate.

When the single-layer graphene is formed on the catalytic substrate, it is transferred to the dielectric layer 120. The transfer process is performed according to a process that is well-known in the related art. For example, polymethyl methacylate (PMMA) is coated on graphene and then a resin layer is formed on the graphene through a thermal process. The graphene on the resin layer is transferred to the dielectric layer 120 again, and then the resin layer or PMMA is removed using a solvent including acetone and the like. Residual PMMA may be completely removed through annealing and the like. As described above, the graphene channel 140 may be formed over the dielectric layer 120.

Thereafter, the source electrode 170 and the drain electrode 180 are respectively formed at both end portions of the graphene channel 140. The formation of each of the source electrode 170 and the drain electrode 180 may be performed through various methods. For example, the source electrode 170 and the drain electrode 180 may be formed through patterning and selective etching using a conventional deposition and a conventional photographic process. Also, the source electrode 170 or the drain electrode 180 may be formed by a thermal deposition using a hard mask, and alternatively, it may be formed by a lift-off process using a photoresist. That is, a photoresist pattern is formed, and a pattern of a region in which the source electrode 170 and the drain electrode 180 are formed is open. Thereafter, metal is deposited on the entire surface, and the photoresist pattern is removed through ashing. Through as such, the source electrode 170 and the drain electrode 180, which are patterned, may be formed.

Also, the doping metal layer 160 is formed over the graphene channel 140. The formation of the doping metal layer 160 may be performed through various methods which are described in the manufacturing of the electrodes 170 and 180.

A manufacturing order of the doping metal layer 160, the source electrode 170, and the drain electrode 180 may be interchanged with one another. Here, a hydrogen annealing process intervenes after the doping metal layer 160 is formed and before the passivation layer 190 is formed. A dipole between the doping metal layer 160 and the graphene channel 140 is removed through the hydrogen annealing, and a doping profile is stabilized. Further, through the hydrogen annealing process with respect to the doping metal layer 160, the first graphene region 141, the second graphene region 142, and the doped graphene region 143 may be defined.

After the hydrogen annealing process is performed, the passivation layer 190 is formed. Alternatively, the hydrogen annealing process may be performed after the passivation layer 190 is formed.

Figure 6:
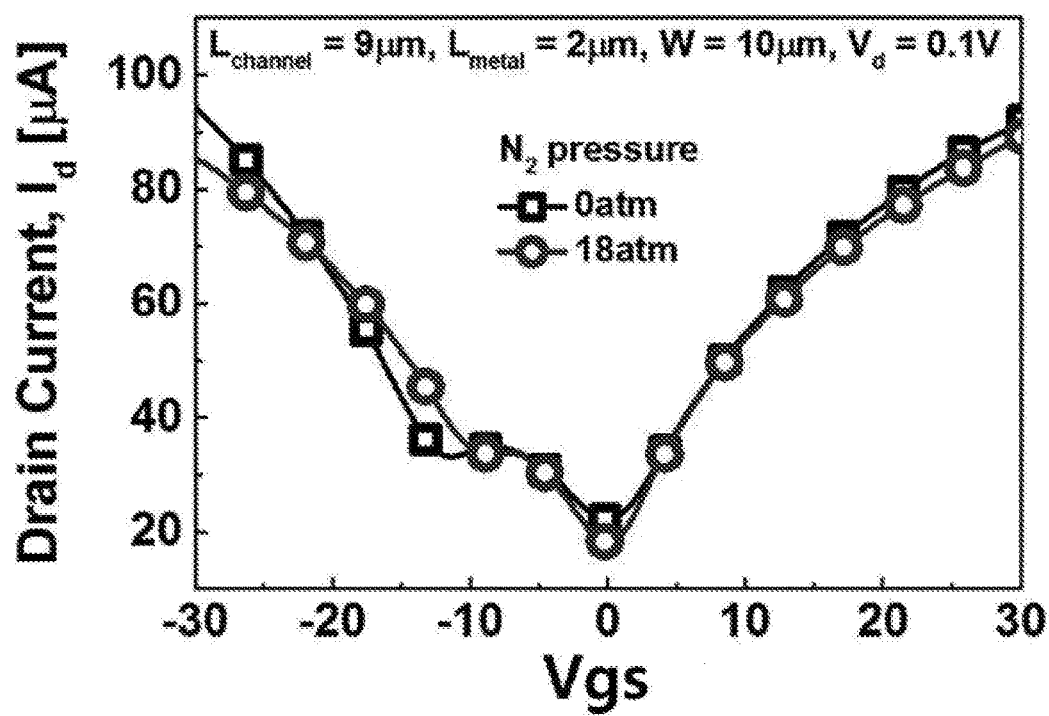
FIGS. 6 and 7 are graphs illustrating effects of hydrogen annealing according to the first embodiment of the present disclosure.
Figure 7:
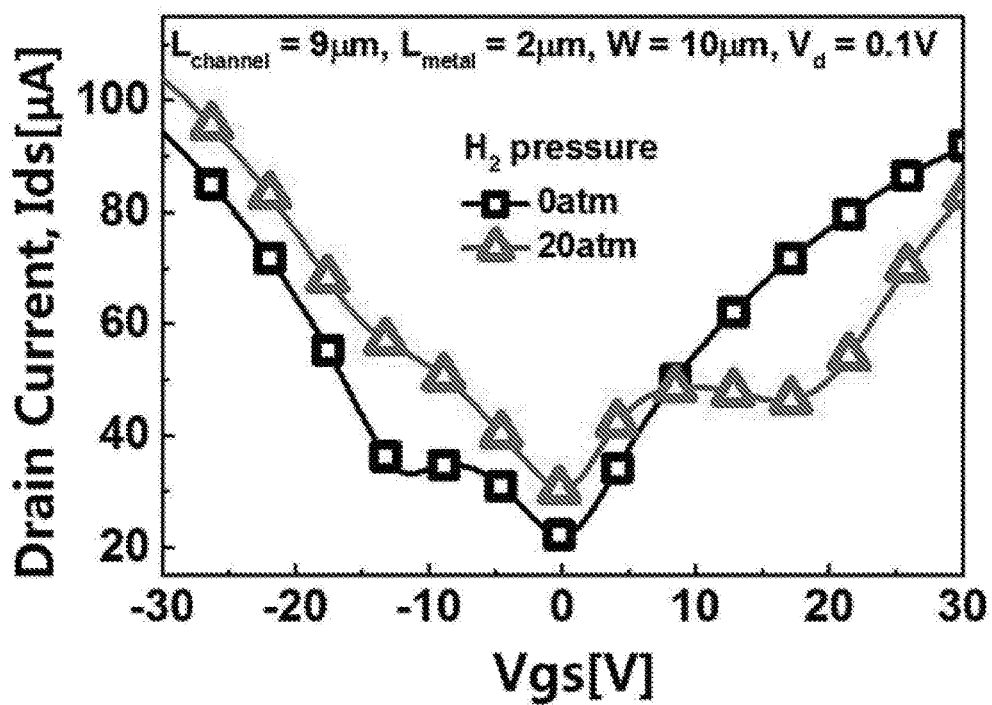

FIGS. 6 and 7 are graphs illustrating effects of the hydrogen annealing according to the first embodiment of the present disclosure.

Referring to FIG. 6, a width between the source electrode 170 and the drain electrode 180 is 9 um, and the doping metal layer 160, which is formed over the graphene channel 140, is configured with a Pt material. Therefore, the doped graphene region 143 below the doping metal layer 160 should be doped with a p-type.

Also, a width of the doping metal layer 160 is 2 um, a gate-source voltage Vgs swings in the range of about −30V to 30V, and a voltage difference $V_d$ between a drain and a source is set to 0.1V. After the doping metal layer 160 is formed, pressure in a chamber is set to 18 atmospheric pressure and nitrogen is supplied. A temperature inside the chamber is set to 300° C., and annealing is performed for two hours.

The annealing using nitrogen gas has no significant difference in a characteristic curve compared to that of annealing performed in a vacuum state in which nitrogen gas is not input.

Referring to FIG. 7, the doping metal layer 160 is used as the same as that of FIG. 6 in size. Here, a difference is that hydrogen gas is used instead of the nitrogen gas.

When the hydrogen gas is used, it can be seen that a Dirac point is moved. That is, a Dirac point of each of the first graphene region 141 and the second graphene region 142 appears at a point at which the gate-source voltage Vgs is about 0V. Consequently, drain current density Ids forms a lowest value. Thereafter, a Dirac point of the doped graphene region 143 appears at a point at which the gate-source voltage Vgs is 20V. Afterward, when the gate-source voltage Vgs is increased, the drain current density Ids is also raised due to an $n^+$-n-$n^+$ junction structure.

Comparing FIG. 6 to FIG. 7, a doping profile is not changed in the annealing in nitrogen atmosphere. However, in the annealing in hydrogen atmosphere, it can be seen that a Dirac point in a doping profile is changed from an electron domain to a hole domain.

The change of the doping profile by the annealing in hydrogen atmosphere is determined by an effect of a dipole that may intervene between the graphene channel 140 and the doping metal layer 160. For example, when the doping metal layer 160 is formed over the graphene channel 140 through deposition and the like, a dipole may be formed at an interface between the doping metal layer 160 and the graphene channel 140 due to various causes including oxide and the like. Even though the high-temperature and high-pressure nitrogen is supplied and the annealing is performed therethrough, it can be seen that the dipole is not significantly affected.

However, when the high-temperature and high-pressure hydrogen is supplied and the annealing is performed therethrough, the dipole at the interface between the doping metal layer 160 and the graphene channel 140 may be removed. Consequently, a Fermi level of the graphene is moved by a work function provided to the doping metal layer 160, thereby showing a behavior in which a hole is doped.

The graphene transistor formed in the first embodiment as described above includes a graphene region that is doped with a specific conductive type. Also, the graphene transistor has a maximum value of resistance at a Dirac point of an undoped graphene region, and further has a maximum value of resistance at a Dirac point of a doped graphene region. Using such maximum values, three states may be implemented. That is, through a region having a low channel resistance in addition to two Dirac points, a region having a maximum value of resistance according to a Dirac point of a doped graphene region, and a region having a maximum value of resistance according to the undoped graphene region, three output states may be obtained.

Second Embodiment

Figure 8:
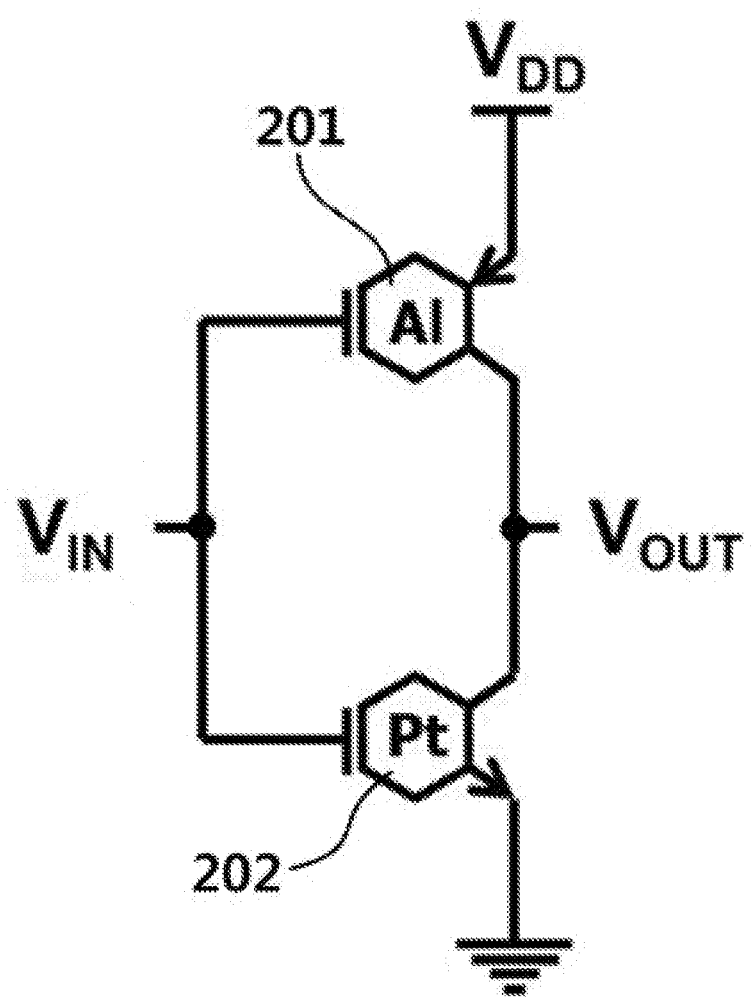
FIG. 8 is a circuit diagram illustrating an inverter using a graphene transistor according to a second embodiment of the present disclosure.

FIG. 8 is a circuit diagram illustrating an inverter using a graphene transistor according to a second embodiment of the present disclosure.

Referring to FIG. 8, a first graphene transistor 201 and a second graphene transistor 202 are connected to each other in series. Also, gate terminals of the respective graphene transistors 201 and 202 are commonly connected to an input signal $V_{IN}$.

In the first graphene transistor 201, a doping metal layer formed on a doped graphene region is metal having a work function lower than that of graphene. For example, the first graphene transistor 201 is a transistor in which the doping metal layer is Al, and in the second graphene transistor 202, a doping metal layer formed on a doped graphene region is metal having a work function higher than that of the graphene. For example, the second graphene transistor 202 is a transistor in which the doping metal layer has Pt. Each of the graphene transistors 201 and 202 operates in the second region of FIG. 2.

A source terminal of the first graphene transistor 201 is connected to a positive source voltage $V_{DD}$, and a drain terminal of the second graphene transistor 202 is connected to a negative source voltage or a ground. Specifically, in FIG. 8, the source terminal and the drain terminal of the respective graphene transistors 201 and 202 do not have configurations that are physically discriminated from each other. However, a terminal connected to a specific bias or power source is referred to as a source terminal. A drain terminal of the first graphene transistor 201 and the drain terminal of the second graphene transistor 202 are connected in common to configure an output signal $V_{OUT}$.

Figure 9:
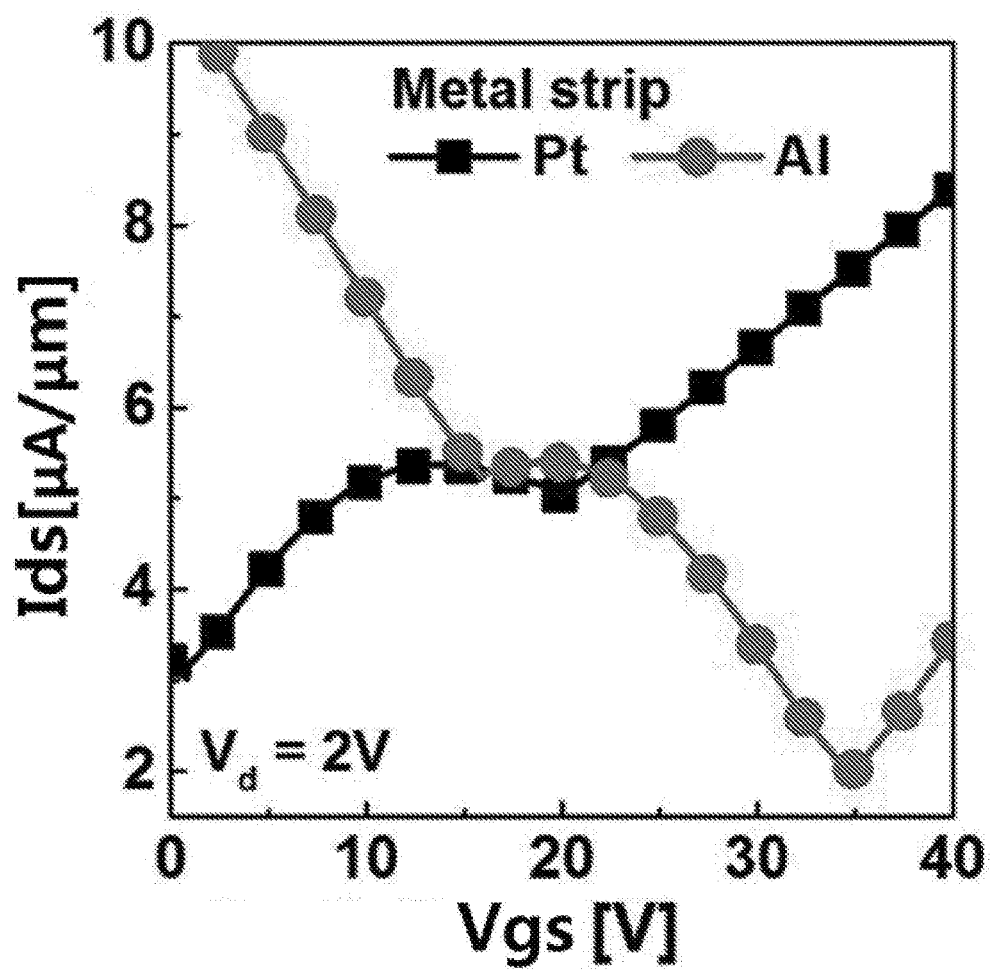
FIG. 9 is a characteristic graph for describing an operation of the inverter of FIG. 8 according to the second embodiment of the present disclosure.

FIG. 9 is a characteristic graph for describing an operation of the inverter of FIG. 8 according to the second embodiment of the present disclosure.

Referring to FIG. 9, a graph marked with "●" represents drain current density Ids according to a gate-source voltage Vgs of the first graphene transistor 201 in FIG. 8. A drain-source voltage $V_d$ is fixed to 2V. Also, a graph marked with "■" represents drain current density Ids according to a gate-source voltage Vgs of the second graphene transistor 202. A drain-source voltage $V_d$ is fixed to 2V. The drain current density Ids represents an amount of current passing a line perpendicular to a flowing direction of a current in a graphene channel.

Also, a configuration of each of the graphene transistors 201 and 202 is the same as the configuration described in FIG. 2. Therefore, a width of the doping metal layer in the first graphene transistor 201 in which Al is used as the doping metal layer is 2 um, and a width of the doping metal layer in the second graphene transistor 202 in which Pt is used as the doping metal layer is also 2 um.

Referring to FIGS. 8 and 9, when the input signal $V_{IN}$ is 0V, Vgs of the first graphene transistor 201 becomes −2V, and Vgs of the second graphene transistor 202 becomes 2V. The first graphene transistor 201 has high current density so that it is modeled to be turned on, and the second graphene transistor 202 has low current density so that it is modeled to be turned off. Therefore, the output signal $V_{OUT}$ is maintained at a high level due to the first graphene transistor 201 that is turned on.

Also, when the input signal $V_{IN}$ is maintained in the range of 15V to 25V, Vgs of the first graphene transistor 201 has a value in the range of 13V to 23V, and Vgs of the second graphene transistor 202 has a value in the range of 15V to 25V. Consequently, the two graphene transistors 201 and 202 form a current of a median range, and thus the output signal $V_{OUT}$ also represents a value of the median range.

Also, when the input signal $V_{IN}$ is raised to have a value close to the range of 35V to 40V, Vgs of the first graphene transistor 201 has a value in the range of 33V to 38V, and Vgs of the second graphene transistor 202 has a value in the range of 35V to 40V. Therefore, due to the high Vgs, the first graphene transistor 201 is turned off and the second graphene transistor 202 is turned on. As a result, the output signal $V_{OUT}$ is maintained at a low level.

Figure 10:
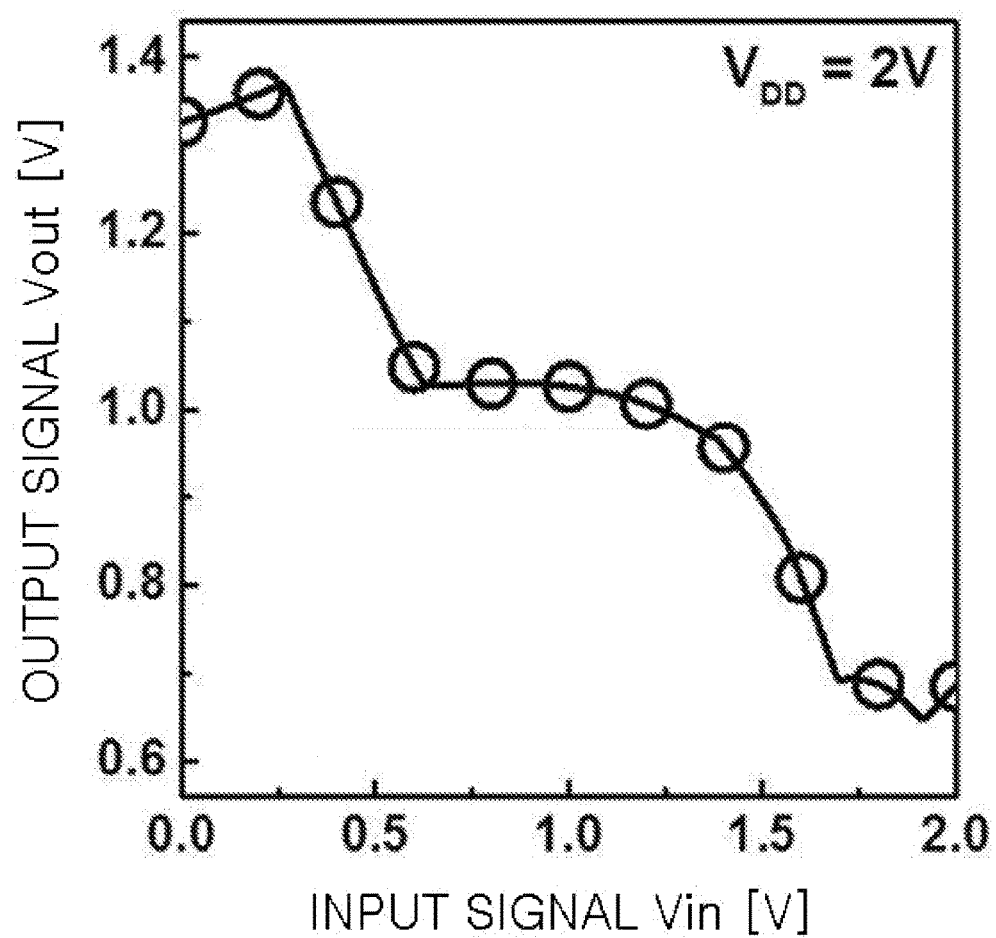
FIG. 10 is a graph illustrating input and output characteristics of the inverter of FIGS. 8 and 9 according to the second embodiment of the present disclosure.

FIG. 10 is a graph illustrating input and output characteristics of the inverter of FIGS. 8 and 9 according to the second embodiment of the present disclosure.

Referring to FIG. 10, an amplifier is provided between the input signal $V_{IN}$ of FIG. 8 and the two graphene transistors 201 and 202 thereof, and a gain of the amplifier is set to 20. Therefore, when the input signal $V_{IN}$ swings from 0V to 2V, a signal in the range of 0V to 40V is applied to gate terminals of the respective two graphene transistors 201 and 202. When the input signal $V_{IN}$ is below about 0.3V, the output signal $V_{OUT}$ has a high level of about 1.3V. Also, when the input signal $V_{IN}$ is in the range of 0.5V to 1.2V, the output signal $V_{OUT}$ has a medium level of about 1.0V. Further, when the input signal $V_{IN}$ is in the range of 1.7V to 2.0V, the output signal $V_{OUT}$ has a low level of about 0.7V.

As described above, the inverter of the present disclosure may implement the three output states. That is, three-region stable output states may be obtained with respect to three input levels. This represents that three states may be implemented by a single inverter.

Therefore, in accordance with the present disclosure, the present disclosure implements three channel resistance states, and further a drain current forms three stable output states. As a result, when the inverter is used as a transistor, three states may be implemented, and, when a logic device is manufactured using the transistor, a ternary device may be realized.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:
1. A graphene transistor comprising:
   a gate electrode having conductivity;
   a dielectric layer formed on the gate electrode;
   a graphene channel having a single-layer graphene formed on the dielectric layer;

a source electrode and a drain electrode respectively formed at both end portions of the graphene channel based thereon and on the dielectric layer;

a doping metal layer formed at a selected region of the graphene channel and configured to dope the graphene channel, which is below the doping metal layer, with a predetermined conductive type; and a passivation layer formed on the graphene channel and configured to shield the graphene channel and the doping metal layer, wherein the graphene channel includes:

a doped graphene region disposed below the doping metal layer and having the predetermined conductive type;

a first graphene region formed at one side of the doped graphene region and having a Fermi level different from that of the doped graphene region; and a second graphene region opposite to the first graphene region based on the doped graphene region and having a Fermi level different from that of the doped graphene region.

2. The graphene transistor of claim 1, wherein a work function of the doping metal layer is lower than a work function of graphene.

3. The graphene transistor of claim 2, wherein the doping metal layer includes Al or Ti.

4. The graphene transistor of claim 2, wherein the doped graphene region has a first Dirac point at a first gate-source voltage having a negative value, and the graphene channel has a maximum value of resistance at the first Dirac point.

5. The graphene transistor of claim 4, wherein the first graphene region or the second graphene region has a second Dirac point at a second gate-source voltage having a positive value, and the graphene channel has a maximum value of resistance at the second Dirac point.

6. The graphene transistor of claim 1, wherein a work function of the doping metal layer is higher than a work function of graphene.

7. The graphene transistor of claim 6, wherein the doping metal layer includes Ni, Au, Pd, or Pt.

8. The graphene transistor of claim 6, wherein the first graphene region or the second graphene region has a first Dirac point at a first gate-source voltage having a negative value, and the graphene channel has a maximum value of resistance at the first Dirac point.

9. The graphene transistor of claim 8, wherein the doped graphene region has a second Dirac point at a second gate-source voltage having a positive value, and the graphene channel has a maximum value of resistance at the second Dirac point.

10. The graphene transistor of claim 1, wherein the graphene channel and the doping metal layer are annealed in hydrogen atmosphere.

11. The graphene transistor of claim 1, wherein the first graphene region and the second graphene region have the same Fermi level.

12. An inverter comprising:

a first graphene transistor connected to a positive source voltage; and a second graphene transistor connected to a ground or a negative source voltage, wherein the first graphene transistor includes a first graphene channel and a first doping metal layer formed on the first graphene channel, wherein the second graphene transistor includes a second graphene channel and a second doping metal layer formed on the second graphene channel, wherein the first graphene channel and the second graphene channel include a doped graphene region, a first graphene region and a second graphene region, wherein the first graphene region formed at one side of the doped graphene region and having a Fermi level different from that of the doped graphene region, wherein the second graphene region opposite to the first graphene region based on the doped graphene region and having a Fermi level different from that of the doped graphene region, wherein gate terminals of the first graphene transistor and the second graphene transistor are commonly connected to an input signal, and wherein drain terminals of the first graphene transistor and the second graphene transistor are commonly connected to an output signal.

13. The inverter of claim 12, wherein the first doping metal layer dopes a first doped graphene region, which is below the first doping metal layer, with an n-type, and includes Al or Ti.

14. The inverter of claim 12, wherein the second doping metal layer dopes a second doped graphene region, which is below the second doping metal layer, with a p-type, and includes Ni, Au, Pd, or Pt.

15. The inverter of claim 12, wherein the first graphene channel, the second graphene channel, the first doping metal layer, and the second doping metal layer are annealed in hydrogen atmosphere.

* * * * *